(12) United States Patent
Hofman

(10) Patent No.: US 6,233,296 B1
(45) Date of Patent: May 15, 2001

(54) CIRCUIT FOR GENERATING A SIGNAL WITH ADJUSTABLE FREQUENCY

(75) Inventor: Ludwig Hofman, Ilmmuenster (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/523,235

(22) Filed: Mar. 10, 2000

Related U.S. Application Data

(63) Continuation of application No. PCT/DE98/02436, filed on Aug. 20, 1998.

(30) Foreign Application Priority Data

Sep. 10, 1997 (DE) ............................................... 197 39 757

(51) Int. Cl.$^7$ ................. H03L 7/18; H03D 3/24
(52) U.S. Cl. ............ 375/375; 375/376; 327/147
(58) Field of Search .................................. 375/375, 373, 375/376; 327/147, 144, 145, 146

(56) References Cited

U.S. PATENT DOCUMENTS

| | | |
|---|---|---|
| 4,145,667 | 3/1979 | Messerschmitt . |
| 5,014,231 | 5/1991 | Reinhardt . |
| 5,351,014 | 9/1994 | Ichiyoshi . |
| 5,517,534 | 5/1996 | Knierim . |
| 5,877,641 * | 3/1999 | Ziegler et al. ............ 327/156 |

FOREIGN PATENT DOCUMENTS

| | | |
|---|---|---|
| 196 53 022 A1 | 6/1998 | (DE) . |
| 0 388 313 | 9/1990 | (EP) . |
| 0 414 445 A2 | 2/1991 | (EP) . |

OTHER PUBLICATIONS

"A new PLL Frequency Synthesis Structure" (Messerschmitt), dated Aug. 1978, IEEE Transactions on Communication, vol. Com–26, No. 8, pp. 1195–1200.

"A short survey of frequency synthesizer techniques" (Reinhard et al.), dated 1986, 40$^{th}$ Annual Frequency Control Symposium, XP 002004081, pp. 355–365.

* cited by examiner

Primary Examiner—Temesghen Ghebretinsae
(74) Attorney, Agent, or Firm—Herbert L. Lerner; Laurence A. Greenberg; Werner H. Stemer

(57) ABSTRACT

A circuit for generating a signal with adjustable frequency contains a reference oscillator for generating a reference signal, a comparison signal device having an addition value input and a clock input for generating a digital comparison signal, whose frequency depends on an addition value signal present at the addition value input and on a clock signal present at the clock input. A phase comparator generates a tuning signal that depends on the result of a comparison of the phase of the reference signal with the phase of the comparison signal. An oscillator, which is driven by the tuning signal, generates the output signal and an oscillator signal, from which the clock signal present at the clock input of the comparison signal device can be derived. A high-quality signal is generated by the circuit according to the invention. The circuit nonetheless has a low current consumption and outlay on components and can be readily integrated.

10 Claims, 2 Drawing Sheets

CIRCUIT FOR GENERATING A SIGNAL WITH ADJUSTABLE FREQUENCY

CROSS-REFERENCE TO RELATED APPLICATION

This is a continuation of copending international application PCT/DE98/02436, filed Aug. 20, 1998, which designated the United States.

BACKGROUND OF THE INVENTION

Field of the Invention

The invention relates to a circuit for generating a signal with adjustable frequency. In particular, the invention is intended for generating a radiofrequency signal, as is required for example in radio transmission apparatuses, cordless telephones, mobile telephones and other transmission apparatuses and systems. The possibility, afforded by the invention, of adjusting the frequency of the generated signal can be used for example for the purpose of frequency and/or phase modulation of the generated signal. Furthermore, the generated signal may serve as an (unmodulated) carrier signal whose frequency is kept stable with the aim of automatic frequency control independently of changing operating conditions (supply voltage, temperature, etc.).

It has been known heretofore to generate a signal with adjustable frequency by means of a digital synthesis circuit. Such a circuit, which is also referred to as a DDS circuit (DDS=direct digital synthesizing), is contained for example in the module with the type designation AD7008 available from Analog Devices.

That digital synthesis circuit has an accumulator, that is to say a clocked, storing summer with feedback whose counting range is swept through cyclically. The cycle duration depends on the clock frequency and on the magnitude of an applied additive value. The respective present counter reading of the accumulator is output to a look-up table, in order to generate data values which form a sine curve from the counting range that is swept through in sawtooth fashion. The data values generated by the look-up table are converted into an analog, sinusoidal output signal of the digital synthesis circuit by a digital/analog converter.

The output signal of a digital synthesis circuit of this type has relatively poor spectral purity, however. This is due to the fact that the resolution of the digital/analog converter is limited. Furthermore, the look-up table and the digital/analog converter require a high outlay on components, which is higher, the more stringent the requirements made of the signal quality. Finally, the digital/analog converter, in particular, has a relatively high current consumption and is poorly integrable, which is disadvantageous for use in battery-operated apparatuses, such as mobile telephones, for example.

U.S. Pat. No. 5,517,534 discloses, a PLL circuit, i.e., a circuit for generating a signal with adjustable frequency, with the following features: a reference oscillator generates a reference signal. A comparison signal device having an addition value input and a clock input generates a digital comparison signal, whose frequency depends on an addition value signal present at the addition value input and on a clock signal present at the clock input. A phase comparator generates a tuning signal depending on the result of a comparison of the phase of the reference signal with the phase of the comparison signal. An oscillator is driven by the tuning signal and generates the output signal and an oscillator signal, from which the clock signal present at the clock input of the comparison signal device can be derived. The comparison signal device has an accumulator clocked by the clock signal, and the comparison signal is derived from the counter reading of the accumulator. In other words, the pulse generator is clocked by the output signal of the PLL circuit (oscillator signal) and is enabled or inhibited depending on counter readings of a plurality of accumulators.

It has become known from the article "A Short Survey of Frequency Synthesizer Techniques" by V. Reinhardt et al. in Proceedings of the 40th Annual Frequency Control Symposium, Philadelphia, 1986, pages 355–65, to add a random number to the output signal of an accumulator in order to reduce the intensity of sidebands in the output spectrum of DDS circuits.

Additional information, in this context, may be gleaned from the German published patent application DE 196 53 022 A1 (not prior art). There is shown a frequency synthesizer in which overflow pulses of a digital accumulator are fed to a phase detector of a phase locked loop.

SUMMARY OF THE INVENTION

The object of the invention is to provide a circuit for generating a signal with adjustable frequency which overcomes the above-noted deficiencies and disadvantages of the prior art devices and methods of this kind, and which generates a high-quality output signal, has a low current consumption and outlay on components and is readily integrable. It is a particular object to shift low-frequency interfering frequency components in a tuning signal, which can occur in the event of unfavorable operating states, into a higher frequency range by means of the invention.

With the above and other objects in view there is provided, in accordance with the invention, a circuit for generating a signal with adjustable frequency, comprising:

a reference oscillator for generating a reference signal;

a comparison signal device having an addition value input receiving an addition value signal and a clock input receiving a clock signal, the comparison signal device generating a digital comparison signal with a frequency dependent on the addition value signal present at the addition value input and on the clock signal present at the clock input;

a phase comparator connected to receive the reference signal from the reference oscillator and the comparison signal from the comparison signal device, the phase comparator comparing a phase of the reference signal with a phase of the comparison signal and generating a tuning signal in dependence on a result of the comparison;

an oscillator connected to the phase comparator and driven by the tuning signal, the oscillator generating an output signal of the circuit and an oscillator signal defining the clock signal present at the clock input of the comparison signal device; and the comparison signal device having an accumulator clocked by the clock signal and having a counter reading;

wherein the comparison signal is derived from the counter reading of the accumulator, and instants of state changes in the digital comparison signal are subjected to jittering by comparison with clock instants of the clock signal.

The invention is based on the fundamental idea of using a controlled oscillator for generating the output signal. The oscillator is tracked in a control loop similar to a PLL (phase locked loop). In this case, the invention makes use of the insight that, instead of a complex digital synthesis circuit, a very much simpler comparison signal device which generates a digital comparison signal from an addition value signal and a clock signal can be used in a control loop of this type.

The circuit according to the invention has a high output signal quality, because the output signal is generated by the controlled oscillator with high spectral purity and an accurately controlled frequency. Despite this high quality, only a relatively low outlay on components is necessary, and the circuit is readily integrable owing to the high digital proportion. In particular, a digital/analog converter is not required, because the comparison signal is a digital signal.

The term "digital signal" as it is used in this text should be understood to be any signal or signal burst from which digital values can be derived. In particular, a digital signal may therefore have a plurality of partial signals which are transmitted on a respective line of a parallel data transmission path. Each partial signal then defines a bit from a digital data word at each instant.

The digital comparison signal is preferably a binary signal having a width of one bit. Such a signal suffices for communicating the required frequency information. The circuit is then particularly simple.

An accumulator as it is used in the novel circuit can be easily integrated as a fully digital component. In a preferred manner, no analog components such as digital/analog converters are provided.

In accordance with an added feature of the invention, the accumulator has a most significant bit and an overflow information item, and the comparison signal is derived from the most significant bit or the overflow information item of the accumulator.

The circuit is particularly simple if no further information items regarding the counter reading of the accumulator are used to derive the comparison signal. In alternative embodiments, however, the comparison signal, particularly if it has a width of a number of bits, is determined in a more complex manner from the counter reading of the accumulator. To that end, it is possible to use for example a plurality of more significant bits of said counter reading.

In accordance with an additional feature of the invention, there is provided a controllable delay device that defines the comparison signal in dependence on the counter reading of the accumulator. This allows shifting the low-frequency interfering frequency components in the tuning signal, which can occur in the event of unfavorable operating states, into a higher frequency range. The delay device determines the comparison signal depending on the counter reading of the accumulator. The delay time of the controllable delay device can be limited to at most a cycle duration of the clock signal or to other values. In other words, the controllable delay device has a delay time between zero and a cycle duration of the clock signal.

In accordance with a preferred embodiment, the delay device is driven by a random number device.

In accordance with a further feature of the invention, there is provided a compensation device for determining the comparison signal in dependence on a current counter reading of the accumulator and on at least one error value of at least one earlier period or half-cycle of the comparison signal. This means that information items regarding error or deviation values of earlier periods or half-cycles of the comparison signal are used for driving the delay device (or generally for generating the comparison signal). In this embodiment of the invention, interfering frequency components can be shifted and filtered particularly effectively.

In accordance with again an added feature of the invention, a clock shaping circuit is connected between the oscillator and the comparison signal device for deriving the clock signal from the oscillator signal. Preferably, the clock shaping circuit is a limiting amplifier and/or a frequency divider.

In the case in which the clock signal of the comparison signal device is derived from the oscillator signal of the controlled oscillator by a frequency divider, the comparison signal device is operated with a clock signal much lower than the output signal, as a result of which the current consumption of the comparison signal device and the requirements imposed on it are reduced.

In accordance with a concomitant feature of the invention, the tuning signal is an analog voltage signal and the oscillator is a voltage controlled oscillator controlled with the analog voltage signal. Such a VCO can be constructed for example using variable capacitance diodes.

Other features which are considered as characteristic for the invention are set forth in the appended claims.

Although the invention is illustrated and described herein as embodied in a circuit for producing a signal with adjustable frequency, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
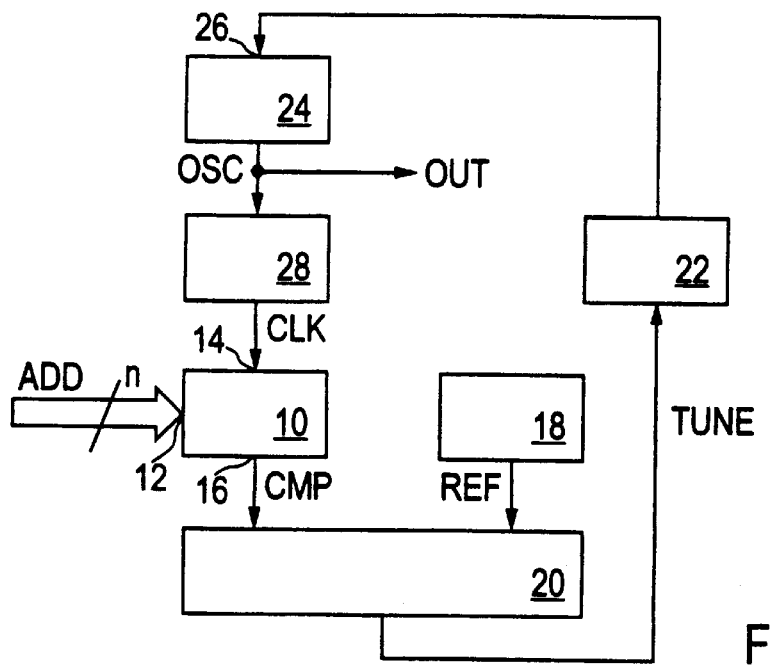
FIG. 1 is a block diagram of an exemplary embodiment of the circuit according to the invention.

Referring now to the figures of the drawing in detail and first, particularly, to FIG. 1 thereof, there is seen a circuit for generating a signal OUT with adjustable frequency. The signal OUT will be designated the output signal below. A digital addition value signal ADD, which determines the frequency of the output signal OUT, is present at an addition value input 12 of a digital comparison signal device 10. The comparison signal device 10, whose function will be described in more detail below, furthermore has a clock input 14 and an output 16 for a comparison signal CMP.

A reference oscillator 18 is designed as a crystal oscillator and outputs a reference signal REF at a constant frequency. The reference signal REF and the comparison signal CMP are present at respective inputs of a phase comparator 20. The phase comparator 20 compares the phase angles of the two signals CMP and REF and generates an analog tuning signal TUNE, which reproduces the result of the comparison. The tuning signal TUNE of the phase comparator 20 is present, via a low-pass filter 22, at a control input 26 of a voltage-controlled oscillator 24.

The voltage-controlled oscillator 24 generates a sinusoidal oscillator signal OSC, which, on the one hand, serves as the output signal OUT of the entire circuit and, on the other hand, is fed to a clock shaping circuit 28. The output signal OUT may, for example, have a frequency of 900 MHz and be conducted to a modulator or a transmission output stage of a mobile telephone.

The clock shaping circuit 28 is designed as a limiting amplifier and generates, from the oscillator signal OSC, a square-wave clock signal CLK, which is present at the clock input 14 of the comparison signal device 10. In alternative embodiments, the oscillator signal OSC can be used directly as the clock signal CLK, thereby obviating the clock shaping circuit 28. In further alternative embodiments, the oscillator 24 is constructed in such a way that it directly generates both the output signal OUT and the clock signal CLK, each with a different signal waveform but at the same frequency.

Overall, in the circuit according to FIG. 1, the voltage-controlled oscillator 24 is tracked like a PLL (phase locked loop) in such a way that the frequencies of the signals CMP and REF correspond. In this case, the comparison signal device 10 acts as a finely adjustable frequency divider, where different, including fractional frequency division factors can be set via the addition value input 12.

In alternative embodiments of the circuit according to FIG. 1, the clock shaping circuit 28 has a frequency divider in order to derive the clock signal CLK for the comparison signal device 10 from the oscillator signal OSC with a fixed division ratio. The frequency of the reference oscillator 18 is also lower by this division ratio. In these alternative embodiments, the comparison signal device 10 need only be designed for lower clock frequencies, and it has a correspondingly lower current consumption.

Figure 2:
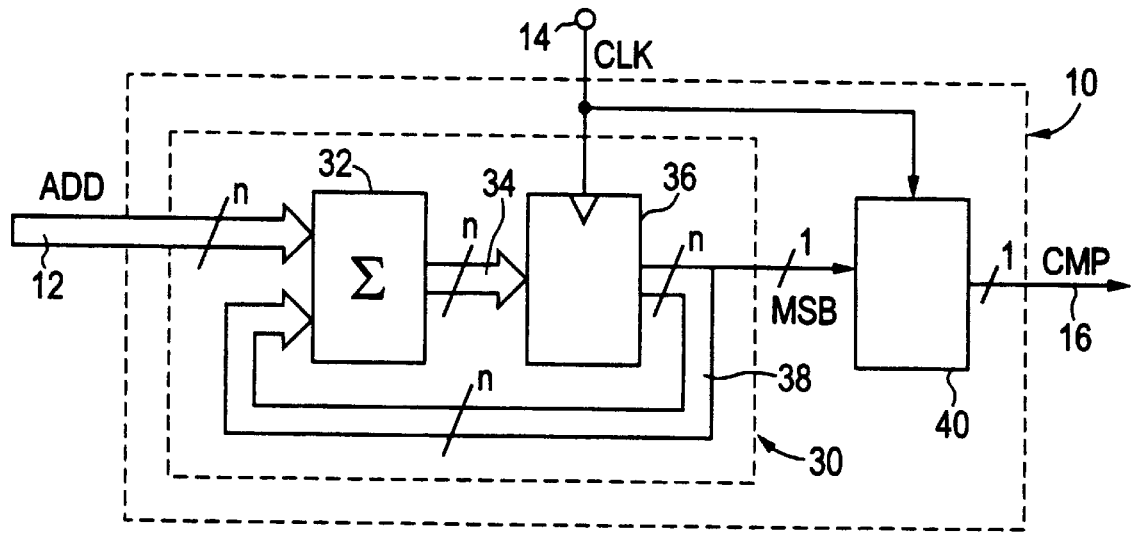
FIG. 2 is a block diagram of a comparison signal device.

With reference to FIG. 2, the comparison signal device 10 contains an accumulator 30. The accumulator 30 is designed as a storing summer with an adder 32 and a clocked latch 36. The latch 36 is connected to an output of the adder 32 via a connection 34 that has a width of n bits. A digital output value of the latch 36 is fed back to an input of the adder 32 by means of a feedback connection 38 having a width of n bits. The other input of the adder 32 forms the addition value input 12 of the comparison signal device 10.

In the exemplary embodiment described here, the bit width is n=32, and the adder 32 and the latch 36 have this width. Any other bit widths are possible depending on the required accuracy and the desired tuning steps. In further alternative embodiments, the bit width of the addition value input 12 may be less than the bit width of the other components of the accumulator 30.

The most significant bit MSB of the digital output value of the latch 36, which is also referred to as the most significant bit MSB of the accumulator 30, is present at a compensation device 40, whose function is explained below. The output value supplied by the compensation device 40 is the digital comparison signal CMP, with a width of 1 bit.

During operation, the accumulator 30 adds the addition value present at the addition value input 12 to the respective present counter reading held in the latch 36, in a clock cycle determined by the clock signal CLK. The addition range of the accumulator 30 is swept through cyclically. Any overflows that occur are not taken into consideration. The duration of a complete sweep through the addition range of the accumulator 30 is proportional to the word width of the accumulator 30, and inversely proportional to the clock frequency $f_{CLK}$ and the addition value present.

An important insight underlying the invention is that the most significant bit MSB of the accumulator 30 defines a binary, cyclic, square-wave signal whose frequency $f_{MSB}$ is equal to the frequency of the sweeps through the addition range. The frequency information which can be derived from the output values of the accumulator 30 is thus already contained in the most significant bit MSB. The following relationship holds true for the frequency $f_{MSB}$:

$$f_{MSB} = \frac{f_{CLK} \cdot \text{addition value}}{\text{addition range}}$$

By changing the addition value, it is possible for the frequency $f_{MSB}$ (and thus the frequency division factor of the comparison signal device 10) to be varied very rapidly and in fine steps.

In an alternative embodiment of the circuit according to FIG. 1 and FIG. 2, the compensation device 40 is dispensed with, and the value of the most significant bit MSB of the accumulator 30 is used directly as the comparison signal CMP. Although such a circuit fulfills its function in principle, it does not reliably generate a spectrally pure output signal OUT. This is because, as a result of the discrete-time clocking of the accumulator 30 by the clock signal CLK, the most significant bit MSB changes its value only at an instant which is shifted by up to a period of the clock signal CLK by comparison with the "correct" instant in the case of a continuously proceeding counting operation.

If, by way of example, an addition value of hexadecimal 05000000, having a width of 32 bits, is present and the latch 36, having a width of 32 bits, of the accumulator 30 has been loaded with a counter reading of hexadecimal 7FFFFFFF due to a clock edge at the instant t, then the MSB should change almost immediately after the instant t given (hypothetical) continuous counting. In actual fact, however, the MSB only changes at the next active clock edge, that is to say with a delay of almost one clock period, whereby the counter reading jumps to hexadecimal 84FFFFFF.

As a result of this quantization error, the signal defined by the most significant bit MSB exhibits jittering by up to a clock period. In most cases this jittering is not critical, since the fluctuations vary rapidly and quasi-randomly over the entire range that is possible. The jittering then causes correspondingly rapid fluctuations in the tuning signal TUNE of the phase comparator 20, which are filtered out by the low-pass filter 22 in the control loop and, consequently, do not impair the quality of the output signal OUT.

It is also possible, however, for the sweep frequency $f_{MSB}$ to be close to integer division ratios of the clock frequency $f_{CLK}$. In other words, the following would hold true:

$$f_{MSB} \approx f_{CLK}/n$$

for n=2, 3, 4, . . .

In this case, the temporal offset of the changeover point of the bit MSB relative to the "correct" instant changes cyclically and relatively slowly between the possible limit values, a sudden changeover taking place if a limit value is reached. This produces modulation of the signal defined by the bit MSB, with a relatively low frequency, which, in the alternative embodiment that is described here and in which the compensation device 40 is omitted, leads to corresponding modulation of the tuning signal TUNE.

Figure 3:
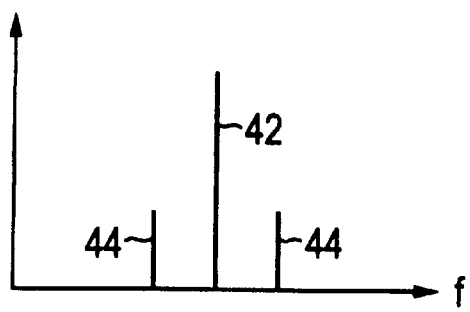
FIG. 3 is a chart illustrating an exemplary frequency spectrum.

Since the relatively slow change in the tuning signal TUNE lies within the control bandwidth of the phase locked loop, it cannot be filtered out, or can be filtered out only to an insufficient extent, by the low-pass filter 22. The oscillator 24 is thus likewise modulated by the interference signal caused by the quantization error. As a result, the output signal OUT has, by way of example, the frequency spectrum illustrated in FIG. 3, which contains interference signal components 44 in addition to a useful signal component 42.

In order to avoid this effect, the compensation device 40 is provided in the exemplary embodiment according to FIG. 2. The compensation device 40 generates the binary comparison signal CMP from the signal defined by the most significant bit MSB. The compensation device 40 has the task of shifting the changeover points of the most significant bit MSB such that, for all operating states, the interference spectrum produced by the quantization jittering is shifted into a high frequency range which can be filtered out by the low-pass filter 22 in the phase locked loop.

In a development, the clocking of the compensation device 40 and/or of the delay device 46 contained therein or of the random number device 48 is effected with a higher clock signal than the clock signal that is fed to the accumulator 30; in particular, the clocking is effected by a multiple of the clock signal of the accumulator 30. To that end, a frequency divider may be connected between clock input 14 and accumulator 30 in the circuit configuration shown in FIG. 2.

To that end, the clocking of the accumulator 30 can be effected either independently of or in a manner dependent on the clocking of the compensation device 40 and/or of the delay device 46 or random number device 48 contained therein. This means that the accumulator 30 and the compensation device 40 and/or the delay device 46 or random number device 48 contained therein are clocked at different frequencies which are either generated by means of the same oscillator and corresponding dividers or multipliers or are generated by different oscillators.

Figure 4:
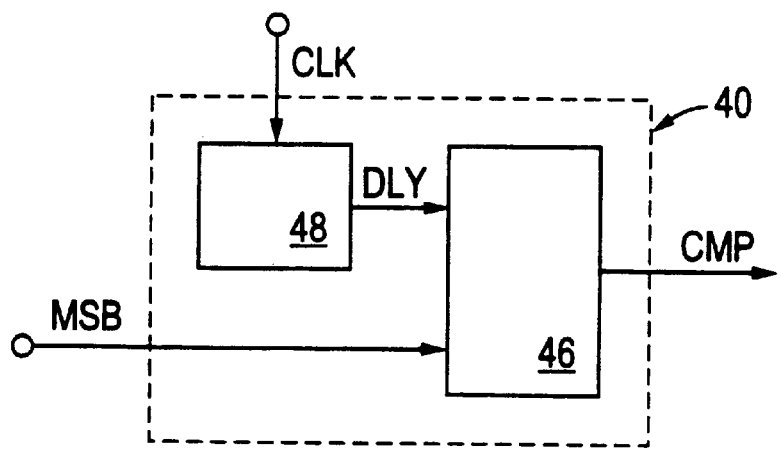
FIG. 4 is a block diagram of a compensation device.

According to FIG. 4, the compensation device 40 has a delay device 46 and a random number device 48. The delay device 46 serves to delay the signal defined by the most significant bit MSB by a time period, dependent on a delay signal DLY, of at most one period of the clock signal CLK. The delay device 46 is in this case designed as a D-type flip-flop which is clocked by the delay signal DLY and at whose data input the signal defined by the most significant bit MSB is present. The random number device 48, which is in this case designed as a polynomial pseudo-random number generator by means of a feedback shift register, generates the delay signal DLY. To that end, the random number device 48 receives the clock signal CLK and, if appropriate, a further clock signal at a higher frequency.

During operation, the compensation device 40 brings about additional, irregular jittering of the comparison signal CMP by comparison with the signal defined by the most significant bit MSB. This prevents the situation where, in unfavorable operating situations, low-frequency interference components are generated by the discrete-time sampling in the accumulator 30.

Figure 5:
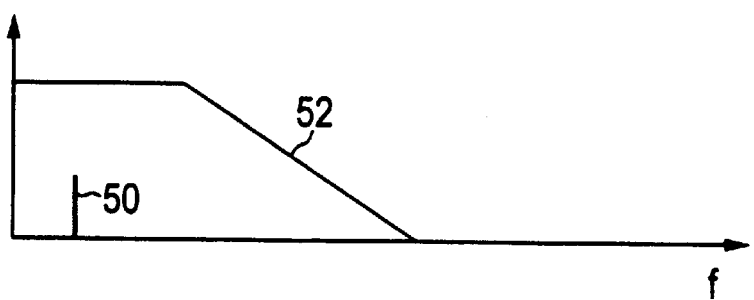
FIG. 5 is a chart illustrating an exemplary frequency spectrum.
Figure 6:
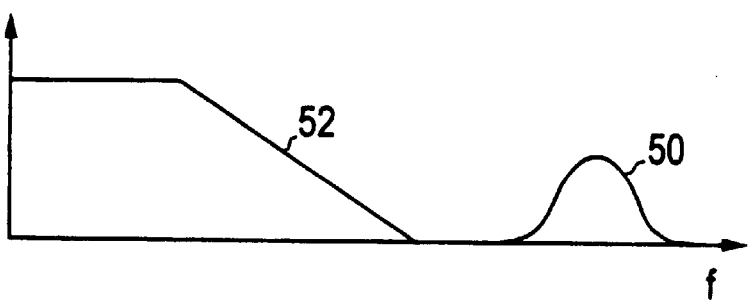
FIG. 6 is a further chart illustrating an exemplary frequency spectrum.

The effect obtained by the compensation device 40 is illustrated in FIG. 5 and FIG. 6, which show frequency spectra of the interfering signal component 50 of the tuning signal TUNE. In a circuit according to the above-described alternative embodiment without the compensation device 40, the interfering signal component 50, as shown in FIG. 5, has a low frequency and lies in the passband of the low-pass filter 22. That passband is designated by the characteristic curve 52. If, on the other hand, a suitable compensation device 40 is used, then the interfering signal component 50, as shown in FIG. 6, forms a higher-frequency interference spectrum which is far removed from the control bandwidth of the phase locked loop and is filtered out by the low-pass filter 22.

In alternative embodiments of the circuit shown in FIG. 4, the signal defined by the most significant bit MSB is not subjected to random jittering by the compensation device 40 but rather is delayed in a targeted manner depending on the quantization errors of previous cycles or changes of the comparison signal CMP. This is intended to achieve reliable shifting of all the interfering frequency components to higher frequencies. In these alternative embodiments, the compensation device 40 receives information items regarding the quantization errors that have occurred, for example an error signal which is derived from a plurality of more significant bits of the latch 36 in the accumulator 30. If, by way of example, a large temporal shift has taken place, in the preceding signal cycle, between the "correct" changeover point of the counter reading given an (assumed) continuous mode of counting and the actual change in the comparison signal CMP (this shift is composed of the quantization error and the delay inserted by the compensation device 40), only a short delay is inserted in the current signal cycle. Conversely, longer delay times are chosen (possibly also exceeding one clock cycle), if the previous shift times were shorter than a predetermined average value.

In further alternative embodiments, the compensation device 40 can also generate a change in the comparison signal CMP temporally before the corresponding change in the most significant bit MSB of the accumulator 30. The requisite information items indicating an imminent changeover of the most significant bit MSB of the accumulator 30 can be derived from the counter reading of the accumulator 30.

I claim:

1. A circuit for generating a signal with adjustable frequency, comprising:

a reference oscillator for generating a reference signal;

a comparison signal device having an addition value input receiving an addition value signal and a clock input receiving a clock signal, said comparison signal device generating a digital comparison signal with a frequency dependent on the addition value signal present at said addition value input and on the clock signal present at said clock input;

a phase comparator connected to receive the reference signal from said reference oscillator and the comparison signal from said comparison signal device, said phase comparator comparing a phase of the reference signal with a phase of the comparison signal and generating a tuning signal in dependence on a result of the comparison;

an oscillator connected to said phase comparator and driven by the tuning signal, said oscillator generating an output signal of the circuit and an oscillator signal defining the clock signal present at said clock input of said comparison signal device; and said comparison signal device having an accumulator clocked by the clock signal and having a counter reading, said accumulator having a most significant bit and an overflow information item;

wherein the comparison signal is derived from the counter reading of said accumulator, the comparison signal is derived from one of the most significant bit and the overflow information item of said accumulator, and instants of state changes in the digital comparison signal are subjected to jittering by comparison with clock instants of the clock signal.

2. The circuit according to claim 1, wherein the digital comparison signal is a binary signal having a width of one bit.

3. The circuit according to claim 1, which comprises a controllable delay device defining the comparison signal in dependence on the counter reading of the accumulator.

4. The circuit according to claim 3, wherein said controllable delay device has a delay time between zero and a cycle duration of the clock signal.

5. The circuit according to claim 3, which further comprises a random number device driving said delay device.

6. The circuit according to claim 1, which comprises a compensation device for determining the comparison signal in dependence on a current counter reading of said accumulator and on at least one error value of at least one earlier period or half-cycle of the comparison signal.

7. The circuit according to claim 1, which comprises a clock shaping circuit connected between said oscillator and said comparison signal device for deriving the clock signal from the oscillator signal.

8. The circuit according to claim 7, wherein said clock shaping circuit is a limiting amplifier.

9. The circuit according to claim 8, wherein said clock shaping circuit is a frequency divider.

10. The circuit according to claim 1, wherein the tuning signal is an analog voltage signal and said oscillator is a voltage controlled oscillator controlled with said analog voltage signal.

* * * * *